United States Patent [19]

Baliga

[11] Patent Number: 4,827,321
[45] Date of Patent: May 2, 1989

[54] METAL OXIDE SEMICONDUCTOR GATED TURN OFF THYRISTOR INCLUDING A SCHOTTKY CONTACT

[75] Inventor: Bantval J. Baliga, Schenectady, N.Y.
[73] Assignee: General Electric Company, Schenectady, N.Y.
[21] Appl. No.: 114,357
[22] Filed: Oct. 29, 1987
[51] Int. Cl.[4] .............................................. H01L 29/74
[52] U.S. Cl. ....................................... 357/37; 357/13; 357/15; 357/23.4; 357/43; 357/55; 357/86
[58] Field of Search ...................... 357/23.4, 22.5, 38, 357/43, 55, 86, 15, 13; 307/304

[56] References Cited

U.S. PATENT DOCUMENTS

| | | | |
|---|---|---|---|
| 3,891,866 | 6/1975 | Okuhara et al. | 307/384 |
| 4,137,545 | 1/1979 | Becke | 357/39 |
| 4,618,872 | 10/1986 | Bauga | 357/38 |
| 4,641,162 | 2/1987 | Yilmaz | 357/38 |
| 4,641,174 | 2/1987 | Baliga | 357/58 |

FOREIGN PATENT DOCUMENTS 53-16584  7/1976  Japan ........................................ 29/74

Primary Examiner—Joseph E. Clawson, Jr.
Attorney, Agent, or Firm—Robert Ochis; James C. Davis, Jr.; Marvin Snyder

[57] ABSTRACT

An MOS gate turn-off thyristor structure includes non-regenerative (three-semiconductor-layer) portions interspersed with four-semiconductor-layer regenerative (thyristor) portions, gate electrode segments disposed adjacent to relatively narrow portions of the base region within the regenerative portion, and either ohmic contacts or Schottky barrier contacts to the non-regenerative portions. Upon application of an appropriate turn-off gate bias to the gate electrode segments, the base region of the regenerative portion in which they are disposed is pinched off and the current flowing therethrough is derived to flow through the non-regenerative portion of the structure. This interrupts regeneration in the regenerative structure and the device turns off. Upon application of a high voltage of one polarity across a device of this type which includes the Schottky barrier contacts, the Schottky barrier maintains the same high stand-off voltage in the non-regenerative portion as the regenerative portion can hold off, thereby enabling the device to hold off high voltages of either polarity.

13 Claims, 5 Drawing Sheets

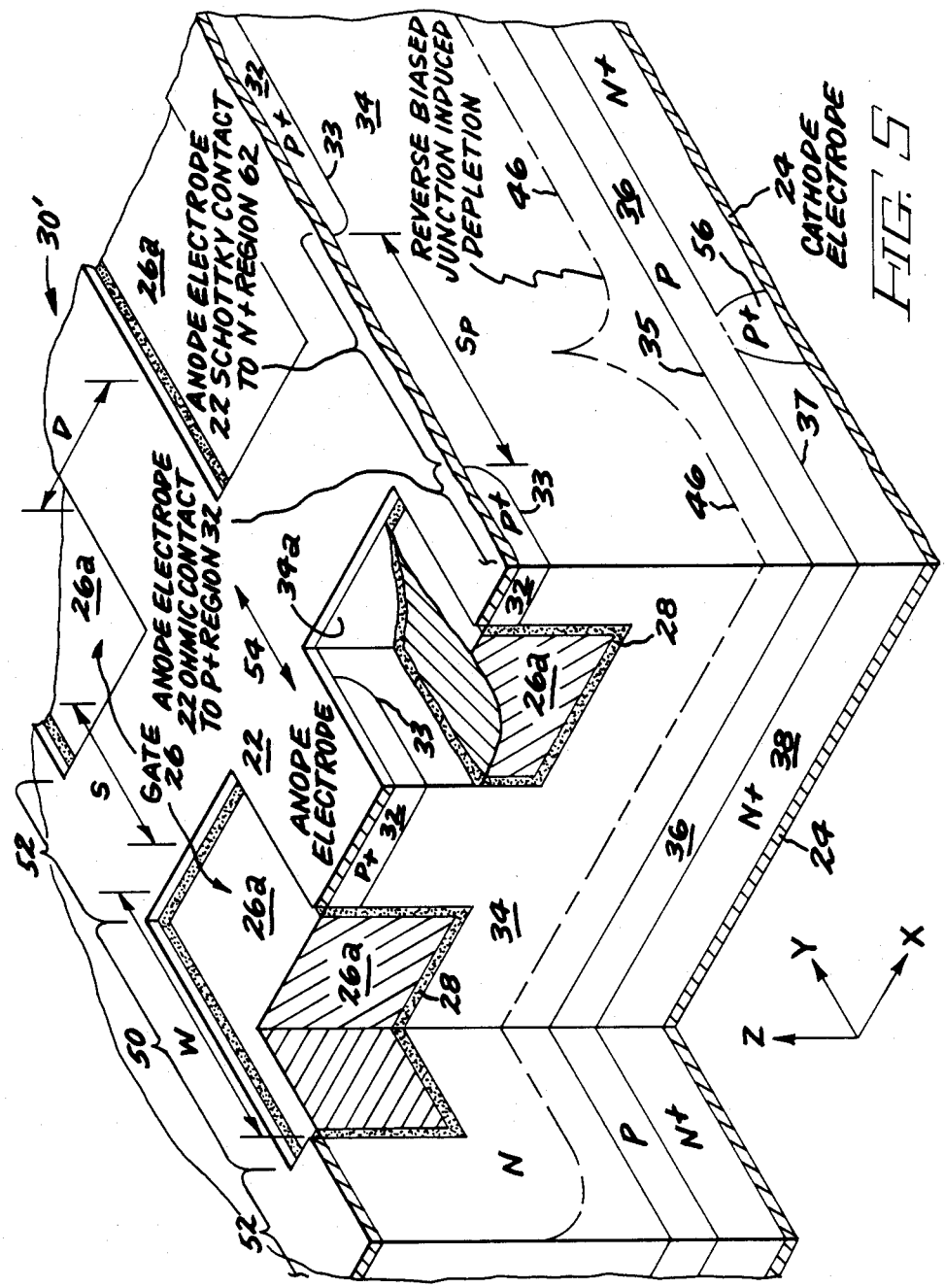

METAL OXIDE SEMICONDUCTOR GATED TURN OFF THYRISTOR INCLUDING A SCHOTTKY CONTACT

RELATED APPLICATIONS

This application is related to U.S. patent application Ser. No. 069,806, filed July 6, 1987, by Bantval J. Baliga, the present inventor, entitled "Metal Oxide Semiconductor Gated Turn Off Thyristor" assigned to the same assignee and on which this invention is an improvement. That application is incorporated herein by reference in its entirety.

FIELD OF THE INVENTION

The present invention relates to the field of four-layer, latching, semiconductor power devices and more particularly, to such devices whose conduction and/or turn-off may be controlled by the voltage on the gate electrode of a metal oxide semiconductor (MOS) portion of the device.

PRIOR ART

A wide variety of four-layer (NPNP) semiconductor devices are known which will latch into an ON condition when conducting sufficient current. This latching is a result of regenerative action which occurs between the PNP transistor and the NPN transistor which are inherent in the four layers of the device structure. Such devices are known generally as thyristors. An ideal device of this type would have no voltage drop between its main terminals in its ON state and, in response to a turn-off signal applied to a gate terminal, would be able to turn off any level of current flowing through the device. In such an ideal device, this turn-off gate signal would require no power.

Early gate turn-off thyristors employed an ohmic contact gate terminal through which enough current (typically one-third of the ON-state main current) could be extracted from the main device current path to terminate the regenerative action which maintains the latched condition. Thus, substantial power was required to turn the device off. Such thyristors required control circuitry capable of carrying the large currents extracted via the gate terminal.

A variety of different metal oxide semiconductor (MOS) gate-turn off thyristors have also been developed in which an MOS gate is used to terminate the thyristor regeneration. Some of these MOS gate turn-off thyristors establish an MOS channel which diverts current from the regenerative path of the device in order to turn the device off. That current may be diverted from the regenerative path of the thyristor into a non-regenerative current path which still includes the main power electrodes. Others of these MOS gate turn-off thyristors include the MOS gate channel in the thyristor current path between the emitter region and the emitter electrode (i.e., in the current path beyond the regenerative four layer structure of the device) and render that channel non-conductive in order to turn the device off. Such a structure has the disadvantage that the relatively high resistance of the MOS channel is in series with the thyristor path which increases the device forward voltage drop in the ON-state.

MOS gated thyristors are generally considered preferable to those in which the gate is directly connected to the semiconductor material by an ohmic contact, since an MOS gate does not carry the large amplitude currents which an ohmic contact gate must carry. However, there is still room for improvement in the operating characteristics of such devices; specifically, achievement of lower ON-state voltage drop, higher ON-state current densities, larger safe operating areas (SOAs) and the ability to turn off larger ON-state currents with minimal gate power is desirable.

The above-identified related Baliga patent application discloses and claims a thyristor-type device having first, second, third and fourth regions of alternating conductivity types arranged in series in that order. This four-layer structure is regenerative and latches when turned ON, thereby providing a low forward voltage drop and high current density for the overall device. The device includes an MOS gate electrode positioned to pinch off one of the second or third (base) regions to interrupt the regenerative thyristor action to turn the device off. Also included in one embodiment illustrated therein are non-regenerative portions interspersed with the regenerative portions of the device so that when the base in the regenerative portion is pinched off, the current flowing in the regenerative portion is diverted into the non-regenerative portion of the device. This type of device is referred to as a depletion mode thyristor or DMT because of the inclusion therein of the FET which conceptually is a depletion mode FET, although it can be fabricated as an enhancement mode FET. The specific embodiments illustrated in the aforementioned Baliga application omit the cathode emitter from the non-regenerative portions to prevent regeneration therein.

It is an object of the present invention to provide an improved power semiconductor device of the type that turns-off by pinching off base in a regenerative portion of the device, but which does so in a way which greatly reduces the anode emitter injection efficiency.

It is another object of the invention to provide an improved power semiconductor device of the type in which the anode injection efficiency is suppressed by a Schottky barrier at the semiconductor exterior surface of the non-regenerative device portions on the anode side of the device.

Another object of the invention is to provide a gate turn-off device which has a thyristor section and an adjacent non-regenerative section through which current can be diverted from the thyristor section to the anode electrode upon interruption of the thyristor section current path.

SUMMARY OF THE INVENTION

The foregoing objects are achieved by a semiconductor device having a regenerative or thyristor structure including first, second, third and fourth regions of alternating conductivity types arranged in series in that order and a non-regenerative portion in which the anode electrode contacts the anode base region. The four-layer regenerative (thyristor) portion of the structure latches when turned ON, thereby providing a low forward voltage drop and high current density for the overall device. The device includes an MOS gate electrode disposed adjacent at least one of the base (second or third) regions of the regenerative portion of the structure to pinch off the part of that base region which is within the regenerative portion to interrupt or block current flow therein to thereby interrupt the regenerative action and turn the device off. Consequently, when the regenerative portion of the base is pinched off, the current flowing therein in the ON state diverts into the non-regenerative portions of the device until stored charge in the base region dissipates. The non-regenerative portions of the structure are interspersed with the regenerative portions of the device. These non-regenerative portions may be tailored to provide the device with an enlarged safe operating area without adversely affecting the device's ON-state characteristics. The anode-electrode-to-anode-base-region contact may be an ohmic contact or a Schottky barrier contact. Inclusion of a Schottky barrier contact and a pinch off structure for that contact enables the device to hold off large voltages in either of two polarities while still providing non-regenerative structures interspersed with the regenerative one.

The gate electrode may preferably be disposed in a trench or trenches extending into the body of the semiconductor device from the anode surface at which the main anode power electrode makes contact to both the anode emitter and anode base regions. The gate electrode segments are disposed in this trench and control conductivity within the base region of the regenerative portion between adjacent gate electrode segments. To enable the gate electrodes to pinch off all of the regenerative portions of the base region at substantially the same applied gate voltage, the gate electrode segments are preferably substantially uniformly spaced.

The non-regenerative portions of the device which are not pinched off by the gate electrode are distinct from the regenerative portions of the device because they lack the fourth (emitter) layer on the anode side of the overall four-layer structure. The main anode power electrode contacts both the anode emitter layer (in the regenerative portion) and the adjacent anode base layer (in the non-regenerative portion). In accordance with one embodiment of the invention, the main anode contact is in ohmic contact with the anode base layer. In accordance with another embodiment of this invention, that main anode electrode forms a Schottky barrier with the anode base layer to enable the device to hold off large voltages in both polarities.

Either no gate trench is created adjacent to the base of the non-regenerative (three-layer, with either an ohmic contact or with a Schottky barrier contact) portion of the overall structure or the gate is made ineffective for pinching off the base therein by any one of (1) providing a thicker gate oxide adjacent the three-layer sections, (2) providing the three-layer sections with a higher conductivity base region or (3) omitting the gate electrode adjacent to the base of the three-layer portion.

DESCRIPTION OF THE FIGURES

The subject matter which is regarded as the invention is particularly pointed out and distinctly claimed in the concluding portion of the specification. The invention, however, both as to organization and method of practice, together with further objects and advantages thereof, may best be understood by reference to the following description taken in connection with the accompanying drawings in which:

FIG. 5 illustrates the device of FIG. 4 in a reverse blocking state.

DETAILED DESCRIPTION

Figure 1:
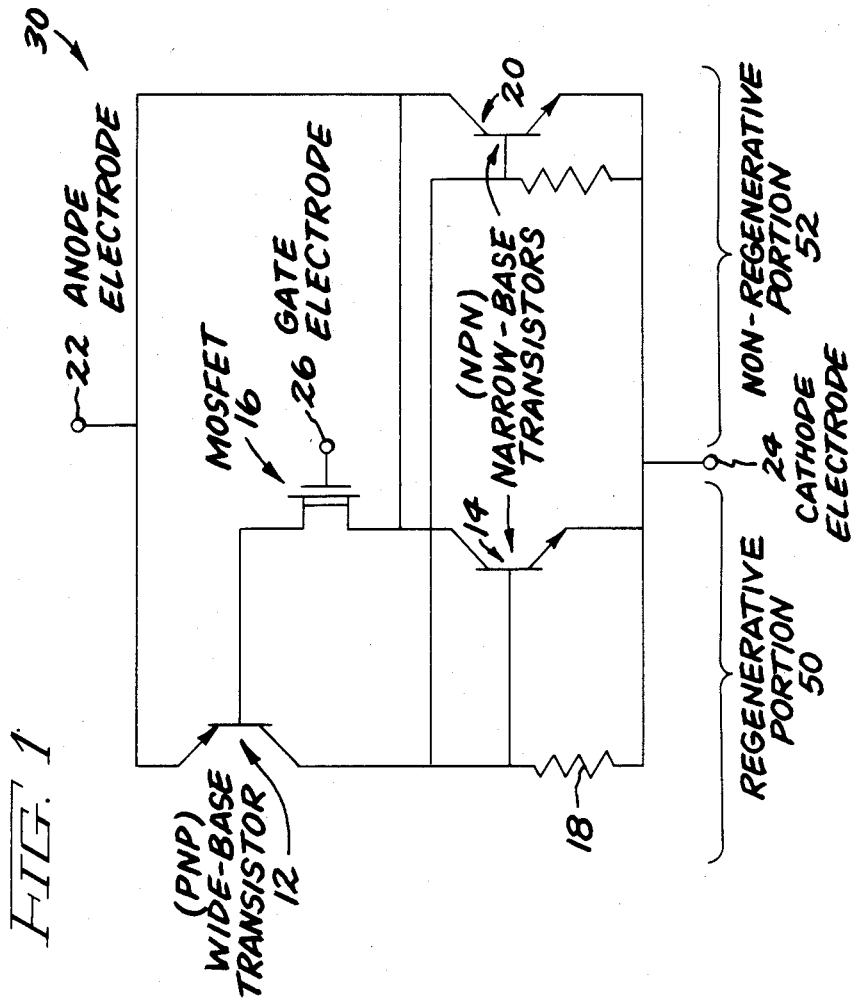
FIG. 1 schematically illustrates an equivalent circuit for a semiconductor device in accordance with the present invention in which the anode electrode is in ohmic contact with the anode base region.

In FIG. 1, one embodiment of a device 30 in accordance with the present invention is shown in equivalent circuit form. This device is represented by an equivalent circuit comprised of a regenerative portion 50 and a non-regenerative portion 52. Regenerative portion 50 includes a wide-base PNP bipolar transistor 12, a narrow-base NPN bipolar transistor 14, a depletion mode MOSFET 16 and a resistor 18. The non-regenerative portion 52, includes a NPN narrow-base bipolar transistor 20 connected in parallel with the regenerative portion 50. This device has three terminals—an anode electrode 22, a cathode electrode 24 and a gate electrode 26. The NPN transistor 20 in non-regenerative portion 52 gets its base current through the PNP transistor 12 in the regenerative portion 50. The two bipolar transistors in the regenerative portion are coupled together to form a thyristor via their connection in a regenerative fashion with resistor 18 connected across the base-emitter junction of the NPN transistor. In the actual physical device, this regenerative connection is a distributed, internal one. The FET 16 is connected in the path between the base of PNP transistor 12 and the collectors of NPN transistors 14 and 20. As shown, device 30 is a high voltage device with the FET in the wide-base (high voltage supporting) portion of the structure. FET 16 is in the regenerative loop of the overall structure. Thus, if the FET is turned off, current regeneration is immediately stopped.

The device 30 of FIG. 1, for operational use, is connected in a circuit with its cathode electrode 24 connected to ground and its anode electrode 22 connected to one side of a load having a positive voltage applied to its other side. In order for device 30 to turn on, the channel region of the MOSFET 16 must be conductive between the source and drain regions. For a depletion mode MOSFET 16, this can be ensured by applying a voltage of 0 volts or a more positive voltage to the gate electrode 26 relative to the anode electrode for the device conductivity types shown. The device 30 may then be turned on by any one of a variety of techniques known in the thyristor art. For example, light may be used to generate hole-electron pairs internally within the device. Whatever the mechanism utilized, the collector current of the PNP transistor 12 drives the base of both of the NPN transistors 14 and 20 thereby causing them to begin conducting. These transistors draw their collector current partially from the base of PNP transistor 12 via the FET 16 and partially directly from the anode electrode 22. Provided the gain of the transistors is sufficient (as it must be for the device to operate as a thyristor), the device will latch in an ON condition at sufficient anode-electrode-to-cathode-electrode current. Once latched, the device will have an ON voltage in the neighborhood of 1 volt as a result voltage drop of about 0.7 of a volt across one of the PN junctions and the other PN junctions having voltages there across which are equal in amplitude and opposite in polarity with the result that they cancel. The additional voltage drop over that of a forward biased junction is a result of contact resistance and resistive voltage drops within the device and will vary with the details of the device layout and fabrication.

In order to turn this device off, a voltage is applied to the gate 26 which renders the MOSFET 16 non-conductive thereby interrupting or blocking the base circuit of PNP transistor 12 with the result that no base current can flow in the PNP transistor 12 and it turns off. The stored charge within the narrow base of the structure can drive the NPN transistors 14 and 20 with a reduced conductivity until that charge is dissipated. However, since most of the stored charge is in the wide base region, the continuing conductivity of the transistors 14 and 20 is a rather minor contributor to the removal of excess charge from the device. Holes within the device are attracted to the cathode electrode 24 and, so long as the device include cathode emitter base shorts, encounter no barrier in flowing to that electrode other than the requirement of quasi-neutrality which prevents the buildup of a large excess of either type of carrier within the structure. If the connection from the anode electrode 22 to the collectors of the NPN transistors were missing, then there would no path which the electrons in the wide base could follow to the anode electrode 22 because of the blocking effect of the emitter-base junction of the PNP transistor 12 and FET 16. However, because the anode electrode 22 is ohmically connected directly to the collectors of transistors 14 and 20, electrons have an unobstructed path from the collector region of these transistors to the anode electrode. As a result, electrons flow readily to the anode electrode 22 while holes simultaneously flow readily to the cathode electrode 24 without the creation of any significant charge imbalance within the device 30. The sum of these hole and electron currents is the current which continues to flow in the device until such time as the excess charge carriers have been swept from the device. The amplitude of this current will be a maximum immediately after the beginning of turn-off and will decrease as the quantity of excess carriers remaining in the device decreases. When the excess carriers have all been swept from the device, the current flow from the anode electrode to the cathode electrode ceases and the device is off. A high blocking voltage after turn-off is sustained by the collector-base junction of the NPN transistors which is also the base-collector junction of the PNP transistor.

So long as the MOSFET 16 is in a conducting state (whether current is actually flowing therethrough or not), the anode injection efficiency of this device is high since the PNP transistor 12 has a high emitter-base injection efficiency when its base region is conductive. When the MOSFET 16 is in a non-conductive state, the anode injection efficiency of the overall device is low because the PNP transistor's emitter-base junction has low injection efficiency when MOSFET 16 blocks current from flowing through the base region of that device and the only current path from the anode electrode 22 is via the ohmic contact which has zero injection efficiency. Consequently, the ability of the device 30 to conduct between the anode electrode 22 and the cathode electrode 24 is controlled by the anode emitter injection efficiency which is in turn controlled by the state of the MOSFET 16.

Figure 2:
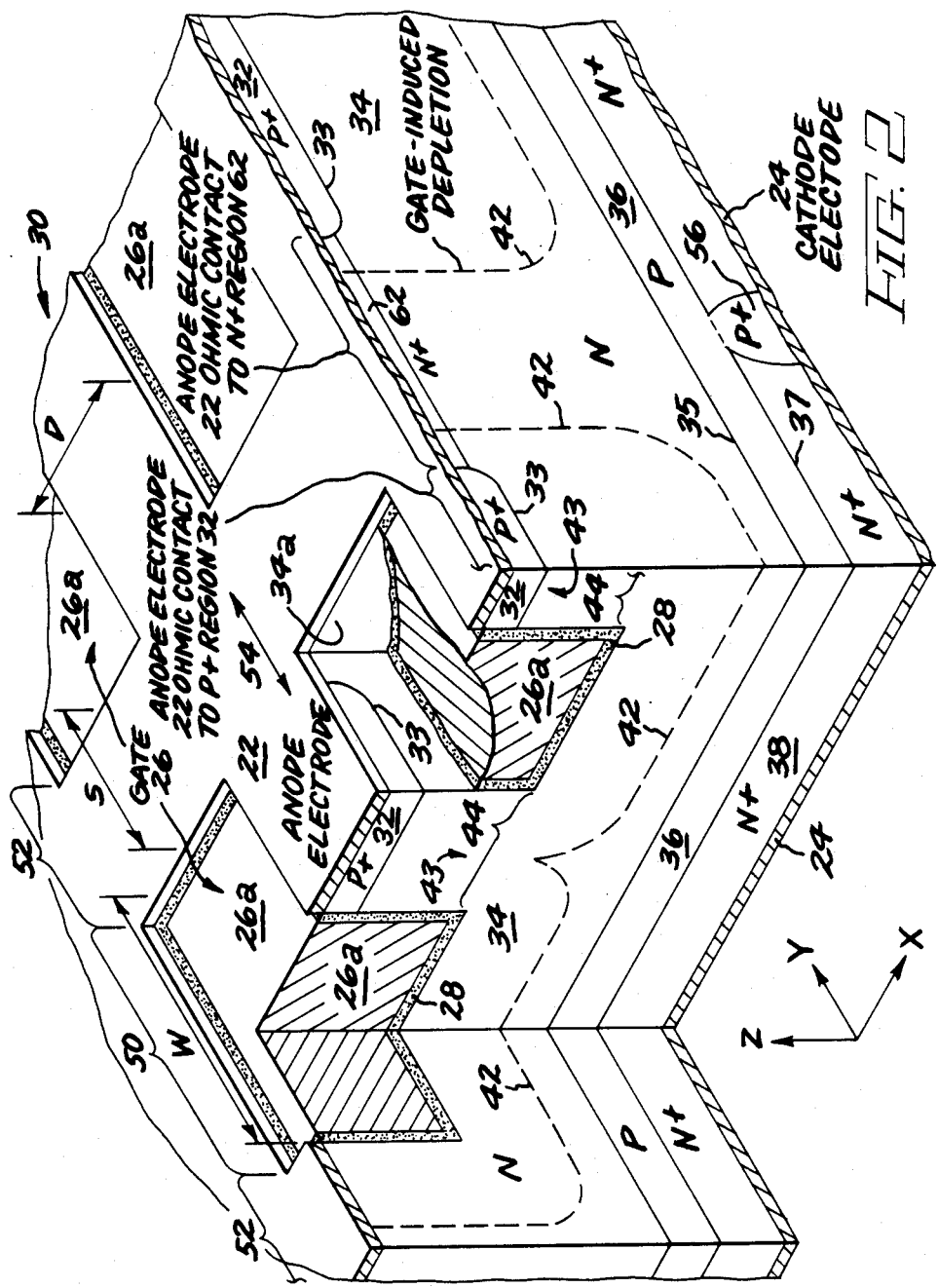
FIG. 2 is a sectional, partially cutaway, perspective view of an embodiment of a device in accordance with the present invention which has the equivalent circuit of FIG. 1.

The device structure 30 shown in FIG. 2 has the equivalent circuit shown in FIG. 1. An orthogonal X,Y,Z coordinate system is defined at the lower left of FIG. 2. These coordinates are used in the following description in referring to directions within the device structure. The device comprises, from top to bottom in FIG. 2, an anode contact or electrode 22, a P+ (anode) emitter 32, an N type (anode) base or drift region 34, a P type (cathode) base region 36, an N+ (cathode) emitter region 38 and a cathode contact or electrode 24. The N type base or drift region 34 is the so-called wide base of the device because its top-to-bottom width in FIG. 2 is made (1) much wider than the top-to-bottom width of region 36 and (2) wide enough to support the maximum voltage that the device is designed to hold off. Within anode base region 34, a MOS gate 26 is disposed adjacent the base material. MOS gate 26 is comprised of a plurality of electrode segments 26a spaced from the anode base region 34 by a gate insulator 28 which may be an oxide of the semiconductor material. Gate electrode segments 26a are shown arranged in X-direction extending rows and Y-direction extending columns, but may be arranged in any desired manner.

X-direction-adjacent gate electrode segments 26a are spaced apart in that direction in FIG. 2 by a distance D which is made small enough that upon application of an appropriate control voltage to gate electrode 26, the portion of the base region situated between X-direction-adjacent electrode segments 26a is pinched off. The distance D may be as large as about 20 microns, but is preferably as small as possible. The pinch-off of the base region is illustrated by dashed lines 42 which mark the edges of the depletion regions induced by the different electrode segments 26a. The region between each electrode segment and dashed line 42 around it is depleted of mobile carriers by the applied gate voltage. These depletion regions induced by X-direction-adjacent electrode segments 26a merge in pinch off regions 43, thereby pinching off the channel current path 44 between those gate segments. This blocks or cuts off the base drive to the wide base PNP transistor resulting in termination of the regenerative action. Complete pinch-off of channels 44 is not required to shut off the device. What is required is that the channels 44 be narrowed enough that the overall injection efficiency of the anode emitter junction is reduced to a value which interrupts the device's regenerative action.

Y-direction-adjacent electrode segments 26a are spaced apart in that direction by a distance S which is made large enough that the portion of region 34 between Y-direction-adjacent electrode segments 26a is not pinched off at the voltage which pinches off the portions of region 34 between X-direction-adjacent electrode segments 26a. Thus, for uniform doping of region 34, the spacing S is larger than the spacing D and may preferably be from 2 to 10 times D and measure between 20 and 100 microns in silicon. The dimensions of the spacings S and D in the figures are drawn to different scales in order to illustrate a 2×2 array of gate electrode segments 26a. While there is no upper limit on S, making S larger than necessary reduces the portion of the device area which is regenerative.

As an alternative to making S larger than D, the distance to which the depleted regions extend into the non-regenerative section for a given gate voltage can be reduced as compared to the regenerative portion. This can be accomplished in a variety of ways. For example, the gate insulator can be made thicker on the side of the gate toward the non-regenerative portion as at 34a or the doping level within the non-regenerative portion of region 34 can be increased.

Application of an appropriate turn-off gate voltage to gate 26 interrupts or blocks the electron current path in the anode base 34 of the regenerative (thyristor) portion 50 of the structure and interrupts hole injection by anode emitter 32, but does not interrupt the electron current path in the non-regenerative portion 52. This interruption of the hole injection breaks the regenerative action and shuts off the thyristor portion of the device. In a structure of this general type which is uniform and thus contains no non-regenerative portion, there would be no alternative current path for the device current. That would result in an abrupt device turn-off. Under those circumstances, substantial excess mobile charges would be present in the non-depleted portions of base region 34 at the time of turn-off. That excess charge creates a disadvantage for the device when controlling an inductive load because those excess charges limit the safe operating area (SOA) of the device at the time of turn-off. Any such excess charges would eventually dissipate via recombination. However, since the device of FIG. 2 includes the non-regenerative section 52 which comprises an alternative path for the current at the time the regenerative section 50 turns off, the device current can continue to flow until the stored charge has dissipated. The regenerative portions 50 and the non-regenerative portions 52 are each shown in FIG. 2 in the form of the X-direction-extending rows which alternate with each other in the Y-direction.

In accordance with this embodiment of the present invention, the main anode power electrode 22 is in ohmic contact with the N type (anode) base region 34 in the non-regenerative portion 52 of the device. The anode base region 34 includes an N+ portion 62 adjacent the surface and in contact with the anode electrode 22 in order to ensure the formation of an ohmic contact between the anode base region and that electrode. As a consequence of this device structure, the non-regenerative portion 52 of the device is a three layer NPN transistor which, by its inherent nature, is non-regenerative. The presence of the ohmic contact between the anode electrode 22 and the N type base region 34 enables the excess majority carriers in the base region 34 to be rapidly extracted through the anode electrode when the device turns off. That is, at turn-off, excess charge (most of which is stored in the wide base region 34) is attracted toward the anode (electrons) and cathode (holes) electrodes. Hole flow to cathode electrode 24 is unobstructed by the junction 35 and junction 37 is bypassed via the regions 56. However, within the regenerative portion 50, junction 33 and the depletion region pinch-off of channels 44 both block electron flow from base 34 to anode electrode 22. Thus, if the structure were uniform (no non-regenerative portion), the excess charge could only dissipate by recombination which is a slow process in such a high lifetime structure. However, in device 30, the anode electrode 22 makes ohmic contact to base 34 in the non-regenerative portion 52. Thus, in the portion 32, there is no barrier to electron flow to anode electrode 22 and the excess charge is rapidly swept from base region 34. This greatly speeds the process of removing excess charge carriers from within the base region 34. As a result, the device safe operating area or SOA is larger than it would be in the absence of the non-regenerative structure.

This structure is only capable of blocking high voltages when the anode electrode is at a positive potential relative to the cathode electrode, so that the junction 35 between N type base 34 and P type base 36 is the reverse biased junction. When a high reverse bias is applied to junction 35, the depletion region associated with junction 35 extends a long distance into the N type region 34 because of the relatively low doping level in the region 34 and its large width (top-to-bottom in FIG. 2) which together render region 34 capable of supporting that high reverse voltage. However, when the anode is made negative, the junction 37 between the P type base region 36 and the N+ region 38 is the junction which becomes reverse biased. Under those circumstances, the depletion region associated with the junction is wider in P base 36 than it is in the N+ emitter 38. However, due to the relatively high doping concentration in the P type region 36 and its relatively narrow width, it cannot sustain a high voltage and the device breaks down. This is not a problem with the preferred embodiment devices disclosed in the related Baliga application cited above because in those devices, the N base is spaced everywhere from the anode electrode by the anode emitter. As a result, when the anode is made negative relative to the cathode, the junction between the P type anode emitter 32 and the N type anode base is the reverse biased junction and the depletion region can spread across the wide N base without the device breaking down.

Thus, in the embodiment of FIG. 2, the rapid removal of excess carriers upon turn-off is traded off against the ability to hold off a large voltage in the reverse polarity. Devices 30 are suitable for DC circuit applications where large voltages are only applied to the device in the forward direction.

A cut and fill trench which extends to the upper surface of the semiconductor material is provided for gate electrode 26. This trench may be formed by reactive ion etching (RIE) or by other techniques as desired. Once the trench is formed, its surface may be oxidized and the gate electrode material deposited within the trench in order to provide the desired control over conduction within the four-layer portion 50 of the structure. As seen in FIG. 2 and discussed above, the gate electrode is omitted within the three-semiconductor-layer portion of the device structure where the three-semiconductor-layer portion contacts anode electrode 22 via N+ portion 62 of N base region 34. A number of techniques can be used to omit the gate electrode from the region adjacent the base of the three-layer portion of the structure. First, if desired, the trench, the oxide and the gate may all be omitted from this portion of the device (as shown) with the result that a uniform base or drift region 34 is present in the portion of the device in which only three semiconductor layers are present. Second, the trench may extend across the regenerative portion and the gate oxide 28 can be made much thicker in that portion of the device than it is in the regenerative portion of the device. This would increase the threshold voltage for that portion of the MOS gate so that this portion of base region 34 (in the non-regenerative portion of the device) is not pinched off under the gate voltage used to pinch off the regenerative portion 50. Third, the gate electrode material may be omitted entirely from within the oxide in the three-layer portion 52 of the device rather than, or in addition to, making the gate oxide thicker there.

The device 30 preferably includes cathode emitter-base shorts such as that created by P+ region 56 which extends from cathode electrode 24 to cathode base region 36 in order to prevent the device from turning on in response to thermally generated carriers. These shorting regions 56 are preferably located in the non-regenerative portion 52 of the device in order to minimize their effect on intentional (externally stimulated) device turn-on. However, if desired, they may also be present in regenerative portion 50 or may even be located in that portion only.

In operation, application of a sufficiently negative gate voltage to electrode segments 26a in the aforementioned depletion mode thyristor (DMT) device pinches off channel region 44 within the four-semiconductor-layer (regenerative) portion 50 of the structure. Since in the three-semiconductor-layer non-regenerative portion 52 of the structure the gate electrode is missing or is spaced from the base region by a larger thickness of gate oxide, no pinch off occurs in that portion of the structure. Consequently, the current which is blocked from flowing through channels 44 within the four-layer regenerative structure 50 is diverted laterally into the non-regenerative structure 52 where no regeneration occurs, with the result that the device turns off. This has the advantage that rather than current flow through the entire device being cut off abruptly while there are many excess carriers in base region 34, current flow continues through the non-regenerative portion of the structure until those excess carriers have been removed at which time the device shuts off completely. Thus, this structure has a larger SOA than a device which is regenerative everywhere. In order for this diversion of current from the regenerative to the non-regenerative portion to work effectively, the non-regenerative structure 52 must be positioned close enough to every portion of the regenerative structure to limit the length of the diversion current path to a value which enables a substantial portion of the stored electrons to be withdrawn from region 34 via the anode contact 22, rather than permitting those electrons to recombine before reaching the anode contact. This is accomplished by making the Y-direction width W of the regenerative portions 50 relatively small. Widths W of up to about 200 μm are acceptable. A preferred value for W is from about 50 to 100 μm.

As shown in FIG. 2, electrode segments 26a are disposed adjacent to wide base region 34 and spaced from narrow base region 36. As has been discussed, application of an appropriate negative voltage to gate 26 results in pinch off of wide base region 34 which shuts the device off or prevents it from turning on. This device can be turned on exclusively by controlling the voltage applied to gate 26 only if the device structure is sufficiently deficient of cathode emitter shorts (56) that under zero gate bias there are sufficient internally generated (thermal) carriers to turn the device on. In that circumstance, when it is desired to prevent the device from turning on, the channels 44 must be kept at least partially, and preferably completely, pinched off. Alternatively, a separate turn-on structure may be provided. This may involve the use of light to generate hole-electron pairs internally, the provision of a separate gate structure which controls a turn-on current path, or other techniques known in the thyristor art.

The voltage polarity which will result in pinch off of a base region depends on the conductivity type of the base region. Thus, in order to pinch off the N type base region as shown by dashed lines 42 in FIG. 2, a negative voltage must be applied to the gate electrode to deplete the N type anode base region adjacent gate 26.

In device 30 in FIG. 2, the N type anode base region is relatively lightly doped in order to sustain a large blocking voltage. As a consequence, a substantial lateral width of N type base region 34 can be depleted of electrons by application of a relatively low voltage to the gate electrode. In this way, base region 34 is pinched off without inducing an accumulation or inversion layer of holes within the base region adjacent gate dielectric 28. Thus, gate turn off of the regenerative portion of the device is relatively straightforward.

The relatively low doping level in the channel regions 44 of the MOS structure allows these regions to be relatively wide in the X-direction without causing the gate 26 to have an unreasonably high threshold voltage. This relatively low doping level in the channel region does not adversely effect the ON-resistance of the device because hole injection into this region from anode emitter 32 modulates the conductivity of this region while the device is latched ON. Further, the low doping level and the vertical or Z-direction width of base region 34 are determined in a known manner by the maximum voltage which the device 30 is designed to hold off and not by MOS threshold considerations. Consequently, this region does not increase either the length of the ON state current path or its resistance, unlike prior art MOS gated thyristors in which the MOS channel is in series with the thyristor current path.

When the turn-off voltage is applied to the gate 26, the depletion regions induced in N base 34 spread rapidly to pinch off the part of base 34 which is within the regenerative portion of the device. Because of the regenerative action in the four-semiconductor-layer portion 50 of the device, substantial quantities of excess mobile carriers are present in both base regions 34 and 36 at the time turn off is initiated. If the entire device were pinched off (as occurs in the insulated gate thyristor and the uniform, all regenerative, version of this base pinch-off structure), these excess charges would limit the safe operating area of the device because substantial time would be required for them to recombine within the device. However, presence of the non-regenerative section 52 of the device directly adjacent to the regenerative section 50 provides a favorable current path for removal of the electron portion of this charge (as has been discussed, the holes already have a favorable current path to cathode electrode 24). Further, since only the regenerative portion 50 of the structure is pinched off, current can continue to flow between the main terminals through the non-regenerative portion 52 of the structure until these excess mobile charges have been swept out of the device. At that time, the entire device turns off because there is no longer any mechanism for sustaining current through the non-regenerative portion 52 of the device. As a consequence, the mobile charge level in the device is substantially reduced before the voltage across the device rises to its full value. This results in a larger safe operating area (SOA) for the device.

Figure 3:
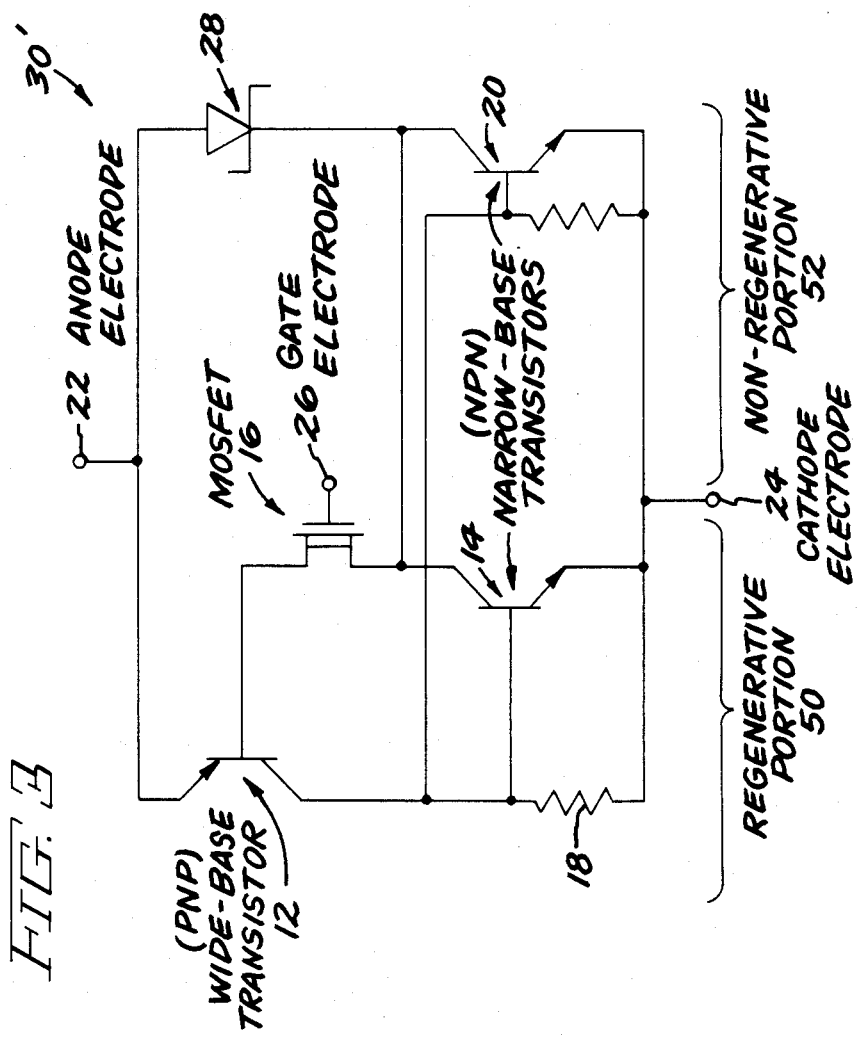
FIG. 3 schematically illustrates an equivalent circuit for a semiconductor device in accordance with the present invention in which the anode electrode forms a Schottky contact to the anode base.
Figure 4:
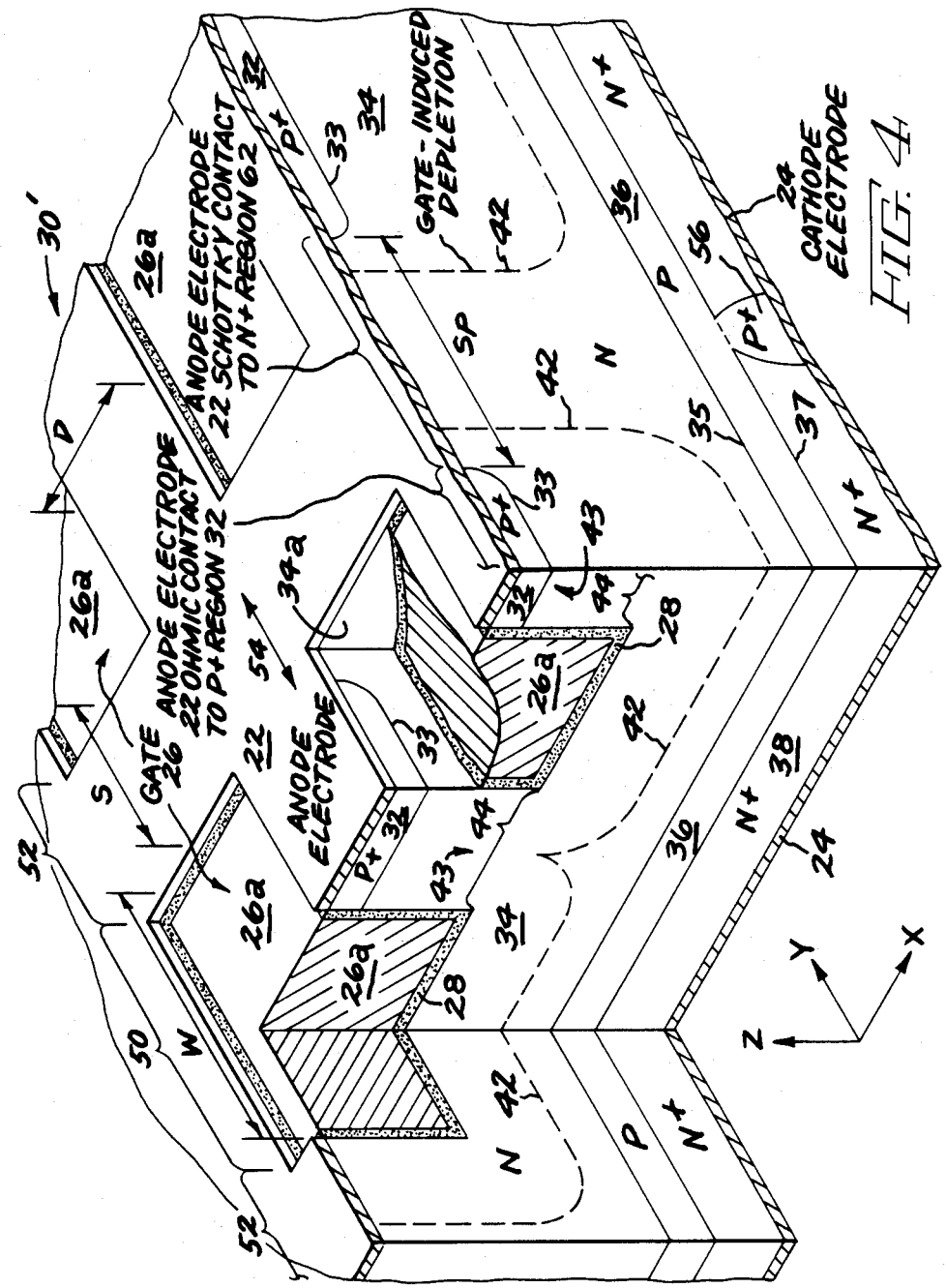
FIG. 4 is a sectional, partially cutaway, perspective view of an embodiment of a device in accordance with the present invention in which the anode electrode forms a Schottky barrier contact to the anode base region.

The ability to block high voltages in both polarities is provided by the device 30' shown in equivalent circuit form in FIG. 3 and in device structure form in FIGS. 4 and 5. In device 30', a Schottky barrier replaces the ohmic contact between the anode electrode and base region 34 in device 30, thereby creating the Schottky diode 28 in FIG. 3. Device 30' is an alternative embodiment of the invention. Device 30' holds off large voltages in both polarities by replacing the ohmic contact between the anode electrode 22 and the anode (N) base region 34 in portion 52 of the device of FIG. 2 with a Schottky barrier contact as shown in FIGS. 4 and 5. The resulting presence of the Schottky barrier diode 28 (see FIG. 3) creates a three-junction (barrier), non-regenerative portion which allows the main current to continue to flow in a manner similar to that in which the transistor section in the above-identified related patent application operates. The forward blocking characteristics of this device are unaffected by the presence of the Schottky barrier, i.e., device 30' has the same forward blocking characteristics as device 30, however, that barrier enables the device 30' to hold off high voltages in the reverse blocking direction as well. Since a Schottky barrier becomes very leaky as the voltage across it increases to a high value, it is preferred to design the device 30' structure with a built-in reverse-blocking pinch-off characteristic which protects the Schottky barrier from high voltages during reverse blocking. This is accomplished by making the repeat distance, or spacing $S_p$ between the P+ anode emitters 32 small enough that, upon reverse bias across the overall device 30' as shown in FIG. 5, the depletion region from the anode emitter-base junction 33 on one side of the Schottky barrier extends laterally across to, and merges with, the depletion region from the anode emitter-base junction on the other side of the non-regenerative section before the Schottky barrier itself becomes excessively leaky. In FIG. 5, the portion of region 34 between the P+ regions 32 and the dashed line 46 is the depletion region. It is preferred that the pinch off occur before 10% of the maximum reverse blocking voltage is applied to the device. A preferred range for the distance $S_p$ depends on the voltage for which the device is designed. $S_p$ may typically be between 10 and 50 microns. More details on the design and operation of such pinch off structures is available in U.S. Pat. No. 4,641,174 issued Feb. 3, 1987, to Bantval J. Baliga, the present inventor, and assigned to the present assignee, which is incorporated herein by reference in its entirety.

The pinch off structure of FIGS. 4 and 5 enables this Schottky contact embodiment of the invention to provide equal blocking voltages in both directions. However, presence of the Schottky barrier increases the time required for removal of excess carriers from the base region 34 of device 30' during turn off over that provided by device 30. However, since the Schottky barrier presents a lower barrier to electron flow than a semiconductor PN junction such as junction 33, the increase in charge extraction time is not as great as it would be if that barrier were a semiconductor junction.

In a silicon device having an N type region at its Schottky contacted surface, an anode electrode 22 of aluminum, molybdenum or tungsten will provide the desired Schottky barrier height of about 0.7 eV.

Many variations can be made in these device structures without departing from the scope and spirit of the invention. For example, while the FET 26 has been described as a depletion mode FET (i.e., one in which the channel regions 44 are conductive when zero gate bias is applied and a negative gate bias is applied to render them non-conductive and to turn the device off), an enhancement mode FET (i.e., one in which those channel regions are non-conductive at zero gate bias with the result that a gate bias must be applied in order to enable the overall device to be turned on and the device is turned off by removal of that gate bias) may be substituted for the depletion mode FET. Further, while the device structures have been shown as vertical devices in which the main current path is vertically through the device from the anode to cathode, they may also be constructed as lateral devices in which the anode and cathode are disposed at the same surface of the semiconductor and the current flow is lateral rather than vertical. The gate electrode segments 26, shown in FIGS. 2, 4 and 5, which have been illustrated as being isolated are preferably interconnected within each X-direction extending row or Y-direction extending column by a relatively narrow spine in order to simplify contact formation and device metallization in a manner which is well known in the power device art. The non-regenerative portion 52 shown in FIGS. 2, 4 and 5 may comprise a single continuous region within which re-generative portions 50 are disposed or portions 50 and 52 may comprise comb-like structures having their tines interdigitated. Multiple cell structures of many different configurations may also be used. Other means for interrupting the base current path or reducing the anode injection efficiency may be provided. Similarly, the conductivity type of every semiconductor region can be reversed (N for P and P for N). Further, if non-uniform turn off of the device is considered desirable, the X-direction spacing of the gate electrode segments 26a may be made non-uniform to cause different channel regions 44 to pinch off at different gate voltages.

While the invention has been described in detail herein in accord with certain preferred embodiments thereof, many modifications and changes therein may be effected by those skilled in the art. Accordingly, it is intended by the appended claims to cover all such modifications and changes as fall within the true spirit and scope of the invention.

What is claimed is:

1. A semiconductor device comprising:
   a body of semiconductor material having first and second opposed major surfaces, said body including a re-generative structure comprising:
   an anode emitter region of P-type conductivity extending to said first surface,
   an anode base region of N-type conductivity, disposed adjacent to and forming a first PN junction with said anode emitter region,
   a cathode base region of said P-type conductivity disposed adjacent to said anode base region, forming a second PN junction with said anode base region and being spaced from said anode emitter region by said anode base region,
   a cathode emitter region of said N-type conductivity disposed adjacent to said cathode base region, forming a third PN junction with said cathode base region and being spaced from said anode base region by said cathode base region;
   anode and cathode power electrodes disposed on and ohmically contacting said anode and cathode emitter regions, respectively;
   an MOS gate structure for controlling the injection efficiency of said anode emitter, said anode emitter having a high injection efficiency when said MOS gate structure is in a first state and having a low injection efficiency when said MOS gate structure is in a second state so as to enable said device to conduct as a regenerative thyristor when said gate is in said first state and to force said device to turn off when said gate is in said second state;

non-regenerative portions interspersed with said regenerative structure, said non-regenerative portions comprising said anode base region, said cathode base region and said cathode emitter region;

said anode electrode contacting said anode base region within said non-regenerative portion;

said anode electrode forming an ohmic contact to said anode base region within said non-regenerative portion and a Schottky barrier contact to said anode base region within said non-regenerative portion; and said non-regenerative portions being narrow enough that when said cathode electrode is sufficiently positive relative to said anode electrode, the depletion regions associated with said first PN junction merge under the Schottky barrier contacts to pinch off the anode base region under the Schottky barrier contacts.

2. A semiconductor device comprising:

a body of semiconductor material having first and second opposed major surfaces, said body including a re-generative structure comprising:

an anode emitter region of P-type conductivity extending to said first surface, an anode base region of N-type conductivity, disposed adjacent to and forming a first PN junction with said anode emitter region, a cathode base region of said P-type conductivity disposed adjacent to said anode base region, forming a second PN junction with said anode base region and being spaced from said anode emitter region by said anode base region, a cathode emitter region of said N-type conductivity disposed adjacent to said cathode base region, forming a third PN junction with said cathode base region and being spaced from said anode base region by said cathode base region; anode and cathode power electrodes disposed on and anode and cathode power electrodes disposed on and ohmically contacting said anode and cathode emitter regions, respectively;

an MOS gate structure for controlling the injection efficiency of said anode emitter, said anode emitter having a high injection efficiency when said MOS gate structure is in a first state and having a low injection efficiency when said MOS gate structure is in a second state so as to enable said device to conduct as a regenerative thyristor when said gate is in said first state and to force said device to turn off when said gate is in said second state;

non-regenerative portions interspersed with said regenerative structure, said non-regenerative portions comprising said anode base region, said cathode base region and said cathode emitter region;

said anode electrode contacting said anode base region within said non-regenerative portion;

said anode electrode forming an ohmic contact to said anode base region within said non-regenerative portion and a Schottky barrier contact to said anode base region within said non-regenerative portion; and said MOS gate structure being disposed adjacent said anode base region in a manner in which when said gate structure is in its second state, said anode base region is pinched off to thereby reduce the charge injection efficiency of said anode-emitter-to-base PN junction.

3. A semiconductor device comprising:

a body of semiconductor material having first and second opposed major surfaces, said body including:

an anode emitter region of P-type conductivity extending to said first surface, an anode base region of N-type conductivity, disposed adjacent to and forming a first PN junction with said anode emitter region, and having a portion extending to said first surface, a cathode base region of said P-type conductivity disposed adjacent to said anode base region, forming a second PN junction with said anode base region and spaced from said anode emitter region by said anode base region, a cathode emitter region of said N-type conductivity disposed adjacent to said cathode base region, forming a third PN junction with said cathode base region and spaced from said anode base region by said cathode base region and extending to said second surface;

anode and cathode power electrodes disposed on said first and second surfaces and ohmically contacting said anode and cathode emitter regions, respectively, said anode power electrode contacting said anode base region where said anode base region extends to said first surface, such that said device includes a regenerative four-semiconductor-layer portion and a non-regenerative three-semiconductor-layer portion, both said portions being disposed between said anode and cathode power electrodes whereby, when current is flowing between said anode and cathode power electrodes through said regenerative portion in a regenerative thyristor mode, interruption of said current flow in one of said base regions diverts enough of said current from said regenerative portion of said device into said non-regenerative portion of said device to interrupt said regenerative thyristor action and turn turn said device off; and means for interrupting current flow through said regenerative portion within one of said base regions without interrupting current flow through said one of said base regions in said non-regenerative portion of said device when said device is operating in a regenerative mode, said means for interrupting current flow comprising an insulated gate electrode disposed adjacent to a pinch-off portion of said anode base region which is within said four-semiconductor-layer portion, said pinch-off portion being narrow enough that application of an appropriate turn-off bias voltage to said gate electrode sufficiently pinches off said pinch-off portion of said anode base region to divert enough of said current from said regenerative portion of said device into said non-regenerative portion to interrupt regenerative thyristor action and turn said device off;

said first surface including a plane portion and a trench portion, said trench portion comprising said first surface of said body where a trench extends into said body from said plane portion;

said anode base region extends to said trench portion of said first surface; and said trench contains a segment of said insulated gate electrode therein within said regenerative portion disposed adjacent to said portion of said anode base region which extends to said trench portion of said first surface.

4. The semiconductor device recited in claim 3 wherein:
said one of said base regions comprises said anode base region.

5. The semiconductor device recited in claim 3 wherein:
each of said emitter regions has a conductivity type determining dopant concentration which is at least one hundred times the conductivity type determining dopant concentration in either of said base regions in said regenerative portion of said device.

6. The semiconductor device recited in claim 3 wherein:
said one of said base regions comprises said anode base region.

7. The semiconductor device recited in claim 3 wherein said anode base region comprises a wide base region and said cathode base region comprises a narrow base region.

8. The semiconductor device recited in claim 7 wherein said one of said base regions comprises said anode base region.

9. The semiconductor device recited in claim 3 wherein:
said anode electrode makes ohmic contact to said anode base region.

10. The semiconductor device recited in claim 3 wherein:
said anode electrode forms a Schottky barrier contact to said anode base region.

11. A semiconductor device comprising:
a body of semiconductor material including a regenerative portion and an adjacent non-regenerative portion, said regenerative portion including adjoining first, second, third and fourth regions of alternating conductivity type disposed in series in that order; and
first and second power electrodes contacting said first and fourth regions, respectively;
means for pinching off one of said second and third regions in said regenerative portion to divert substantially all of current flowing through said regenerative portion between said first and second electrodes in a regenerative mode from said regenerative portion into said adjacent non-regenerative portion to turn said device off when said one of said second and third regions in said regenerative portion is pinched off;
said non-regenerative portion including a Schottky barrier contact to said first power electrode.

12. The semiconductor device recited in claim 11 wherein:
said non-regenerative portion comprises three of said four regions present in said regenerative portion and said Schottky barrier contact is to the one of said three regions which in said regenerative portion forms a PN junction with the one of said first through fourth regions which is omitted from said non-regenerative portion.

13. The semiconductor device recited in claim 11 wherein:
said means for pinching off comprises an insulated gate electrode disposed adjacent said one of said second and third regions in said regenerative portion where said one region is narrow enough that an appropriate turn-off bias voltage applied to said insulated gate electrode will pinch off said one region in said regenerative portion to a sufficient extent to divert enough current from said regenerative portion into said non-regenerative portion to turn said device off.

* * * * *